(12) United States Patent
Chen

(10) Patent No.: US 11,909,384 B2
(45) Date of Patent: Feb. 20, 2024

(54) DIRECT-DRIVE D-MODE GAN HALF-BRIDGE POWER MODULE

(71) Applicant: GaN Systems Inc., Kanata (CA)

(72) Inventor: Di Chen, Kanata (CA)

(73) Assignee: GaN Systems Inc.

(*) Notice: Subject to any disclaimer, the term of this patent is extended or adjusted under 35 U.S.C. 154(b) by 36 days.

(21) Appl. No.: 17/741,813

(22) Filed: May 11, 2022

(65) Prior Publication Data

US 2023/0370059 A1 Nov. 16, 2023

(51) Int. Cl.
| | |
|---|---|
| *H02H 3/24* | (2006.01) |
| *H03K 17/08* | (2006.01) |
| *H03K 17/22* | (2006.01) |
| *H02M 1/36* | (2007.01) |
| *H03K 17/687* | (2006.01) |
| *H03K 17/0814* | (2006.01) |

(52) U.S. Cl.
CPC ........... *H03K 17/223* (2013.01); *H02H 3/243* (2013.01); *H02M 1/36* (2013.01); *H03K 17/08142* (2013.01); *H03K 17/687* (2013.01)

(58) Field of Classification Search
CPC ... H02H 3/243; H02M 1/36; H03K 17/08142; H03K 17/223; H03K 17/687
USPC .................................................. 327/108, 109
See application file for complete search history.

(56) References Cited

U.S. PATENT DOCUMENTS

| | | | |
|---|---|---|---|
| 9,349,715 B2 | 5/2016 | Briere | |
| 9,406,674 B2 | 8/2016 | Briere | |
| 9,692,408 B2 | 6/2017 | Roberts et al. | |
| 9,754,937 B1 | 9/2017 | Lu et al. | |
| 10,720,913 B1 | 7/2020 | Leong et al. | |
| 2014/0055109 A1* | 2/2014 | Guerra ................... | H02M 7/538 323/272 |
| 2014/0070786 A1* | 3/2014 | Guerra .................... | G05F 1/618 323/285 |

(Continued)

OTHER PUBLICATIONS

S. Chellappan, "Design Considerations of GaN devices for improving power-converter efficiency and density" Texas Instruments Tech. Rep. SLYY124, Nov. 2017; pp. 1-8.

(Continued)

*Primary Examiner* — William Hernandez
(74) *Attorney, Agent, or Firm* — Miltons IP/p.i.

(57) ABSTRACT

A protected direct-drive depletion-mode (D-mode) GaN semiconductor half-bridge power module is disclosed. Applications include high power inverter applications, such as 100 kW to 200 kW electric vehicle traction inverters, and other motor drives. The high-side switch is a normally-on D-mode GaN semiconductor power switch Q1 in series with a normally-off LV Si MOSFET power switch M1 and the low-side switch is a normally on D-mode GaN semiconductor power switch Q2. The gates of both Q1 and Q2 are directly driven. M1 in series with Q1 provides a high-side switch which is a normally-off device for start-up and fail-safe protection. M1 may also be used for current sensing and overcurrent protection. For example, a control circuit determines an operational mode of M1 responsive to a UVLO signal and a voltage sense signal indicative of an overcurrent event. Examples of single phase and three-phase half-bridge modules and driver circuits are described.

13 Claims, 4 Drawing Sheets

(56) References Cited

U.S. PATENT DOCUMENTS

| | | | |
|---|---|---|---|
| 2014/0225162 A1* | 8/2014 | Briere | H01L 27/0688 |
| | | | 257/195 |
| 2015/0014698 A1* | 1/2015 | Briere | H03K 17/223 |
| | | | 257/76 |
| 2020/0153427 A1 | 5/2020 | Bagheri et al. | |
| 2020/0287536 A1 | 9/2020 | Udrea et al. | |

OTHER PUBLICATIONS

P.L. Brohlin et al., "Direct-Drive Configuration for GaN devices", Texas Instruments Tech. Rep. LSPY008A, Oct. 2016; pp. 1-7.

G. Patterson et al., "Gallium Nitride—delivering its promise in Automotive Applications",6th Hybrid and Electric Vehicles Conference (HEVC 2016), 2016, pp. 1-6, doi: 10.1049/cp.2016.0982.

R. Allan, "SiC and GaN vs. IGBTs: The Imminent Tug of War for Supremacy" in Power Electronics, Jul. 27, 2017; pp. 1-6.

J. Xu et al., entitled "A Performance Comparison of GaN E-HEMTs Versus SiC MOSFETS in Power Switching Applications" Bodo''s Power Systems Jun. 2017; pp. 36-39.

J. Lu et al., "Loss Distribution among Paralleled GaN HEMTs", 2018 IEEE Energy Conversion Congress and Exposition (ECCE), 2018, pp. 1914-1919, doi: 10.1109/ECCE.2018.8557988.

T. Yoshida et al., "Gate Drive Circuit for Normally on Type GaN FET" 2013; 2nd International Conference on Electric Power Equipment—Switching Technology (ICEPE-ST) Matsue, 2013, pp. 1-4, doi: 10.1109/ICEPE-ST.2013.6804367.

Advanced Propulsion Centre UK, "Power Electronics Roadmap 2020" Narrative Report; Version 1.0 Feb. 2021; 19 pages.

H. Amano et al., "The 2018 GaN power electronics roadmap" J. Phys D: Appl. Phys. 51 163001; pp. 0-48 2018 IOP Publishing Ltd. (https://doi.org/10.1088/1361-6463/aaaf9d).

* cited by examiner

| Time | Event | Q1 | M1 | HS | Q2/LS | UVLO | OCP |
|---|---|---|---|---|---|---|---|
| t0 | Main power on | ON | OFF | OFF | ON | N/A | N/A |
| t1 | VCC reaches Vccmin | ON | OFF | OFF | ON | 1 | 0 |
| t2 | VCC > Vcc,uvlo | OFF | ON | OFF | OFF | 0 | 0 |
| t3 | Operation | PWM | ON | PWM | PWM | 0 | 0 |
| t4 | OCP triggered | OFF | ON | OFF | OFF | 0 | 1 |
| t5 | VCC drops below VCC,uvlo | ON | OFF | OFF | ON | 1 | 0 |

DIRECT-DRIVE D-MODE GAN HALF-BRIDGE POWER MODULE

CROSS-REFERENCE TO RELATED APPLICATION(S)

This application is related to U.S. patent application Ser. No. 17/123,316, filed Dec. 16, 2020, entitled "HYBRID POWER STAGE AND GATE DRIVER CIRCUIT", which is incorporated herein by reference in its entirety.

TECHNICAL FIELD

This invention relates to semiconductor power switching devices and systems comprising half-bridge modules for power switching in high power applications, e.g. automotive and industrial applications.

BACKGROUND

There are growing market opportunities for wide-bandgap semiconductor power switching devices for high power automotive and industrial applications, such as electric vehicle traction inverters, inverters for other motor drives, onboard electrical vehicle chargers, energy storage systems, et al.

Power stages, such as a half-bridge or full-bridge switch topologies, may be implemented using silicon (Si) technology, silicon carbide (SiC) technology, or gallium nitride (GaN) technology, for example. Si IGBT technology for power applications, i.e. using Si IGBTs (Insulated Gate Bipolar Transistors) with Si anti-parallel diodes, is well-established and offers reliable performance at low cost. Wide bandgap (WBG) semiconductor technologies, such as SiC and GaN technologies offer performance advantages, such as, higher efficiency, higher switching frequencies, and reduced losses, but add significantly to semiconductor costs.

An article by R. Allan, entitled "SiC and GaN vs. IGBTs: The Imminent Tug of War for Supremacy" in Power Electronics, 27 Jul. 2017, provides a brief overview of the benefits of GaN HEMTs and SiC MOSFETs vs. Si IGBTs. Power applications span a wide range of voltages from low voltage, e.g. 100V to 300V for consumer electronics and power supplies; medium voltage, e.g. 650V to 1200V for applications such as EV/HEV traction inverters, PV inverters, motor controllers and UPS; and high voltage above 1700V, for applications such as smart power grid, wind power generation, and large-scale transport, e.g. rail and shipping. Thus, it is likely that each of Si, SiC and GaN technologies will continue to co-exist and offer complementary solutions for different automotive, industrial, consumer and other power applications.

Implementation of half-bridge and full-bridge switching topologies using GaN semiconductor technology comprising GaN High Electron Mobility Transistors (HEMTs) for high-side and low-side switches offers performance advantages for many high power applications (see for example an article by J. Xu et al., entitled "A Performance Comparison of GaN E-HEMTs Versus SiC MOSFETS in Power Switching Applications" Bodo's Power Systems June 2017). GaN HEMTs have been a focus in both academia and industry due to ultra-fast switching transitions and extremely low figure of merit (FOM) $R_{DSon} \times Q_G$ compared to silicon counterparts.

There is a need for improved or alternative power semiconductor switching devices, that take advantage of the performance characteristics of devices fabricated with GaN based semiconductor materials.

SUMMARY OF INVENTION

The present invention seeks to provide improved or alternative GaN semiconductor based power switching devices, e.g. half-bridge modules for high power switching applications, which provide at least one of improved performance, increased current per unit die area, and reduced cost.

Aspects of the invention provide a direct drive D-mode half-bridge power module comprising a high-side switch and a low-side switch connected in a half-bridge configuration, wherein the high-side switch is a D-mode (normally-on) GaN transistor switch in series with an E-mode normally-off Si MOSFET switch and the low-side switch is a D-mode (normally-on) GaN transistor switch, wherein gates of the D-mode (normally-on) GaN transistor switches are directly driven, and wherein the gate of E-mode normally-off Si MOSFET is directly driven. M1 is directly driven by control signal so that M1 acts as a protection FET to hold the high-side switch in an off-state during start-up and during a fault condition. For example, the Si MOSFET switch is driven by a control circuit which determines the operational mode of M1 responsive to a UVLO signal and a voltage sense signal indicative of an overcurrent event. For example, the control circuit operates so that: M1 is OFF during start-up until UVLO is off, M1 is ON for normal operation; M1 is turned-off during a fault condition if UVLO is turned-on; and if OCP is triggered, M1 is ON and Q1 and Q2 are turned-off.

One aspect provides a power semiconductor switching device comprising:
  a high-side switch and a low-side switch connected in series in a half-bridge configuration, between a high voltage DC bus (rail) and a low voltage DC bus (rail), the high side switch being connected to the low side switch at a switching node, wherein:
  the high-side switch is a normally-off switch wherein a first normally-on GaN transistor switch (Q1) is connected in series with a normally-off Si MOSFET switch (M1), a source of Q1 being connected to a drain of M1; and the low side switch is a normally-on switch, comprising a second normally-on GaN transistor switch (Q2).

In example embodiments of the power semiconductor switching device, M1 acts as a protection FET to hold the high-side switch in an off-state during start-up and during a fault condition.

For example, Q1 has a source, a drain and a gate, wherein the drain of Q1 is connected to the high voltage DC bus and the source of Q1 is connected to a drain of M1, and the gate of Q is connected to a first gate drive terminal for directly driving the gate of Q1; the source of M1 is connected to the switching node, a gate of M1 is connected to an enable (control) terminal for directly driving the gate of the M1; a high-side ground terminal is connected to the source of M1; and a voltage sense terminal is connected a common point between the source of Q1 and the drain of M1; and Q2 has a source, a drain and a gate, the drain of Q2 is connected to the switching node and the source of Q2 is connected to the low voltage DC bus, and the gate of Q2 is connected to a second gate drive terminal for directly driving the gate of Q2; and a low-side ground terminal is connected to the source of Q2.

For high current, high power applications, Q1 comprises a plurality of GaN transistors connected in parallel; M1 comprises a plurality of Si MOSFETs connected in parallel; and Q2 comprises a plurality of GaN transistors connected in parallel. The GaN transistors may be GaN HEMTs.

Another aspect provides a traction inverter comprising a multi-phase motor driver, wherein each phase leg comprises a half-bridge module as defined above.

Another aspect provides a power semiconductor switching device comprising:

a high-side switch and a low-side switch connected in series in a half-bridge configuration, between a high voltage DC bus and a low voltage DC bus, the high side switch being connected to the low side switch at a switching node, wherein:

the high-side switch is a normally-off switch wherein a first normally-on GaN transistor switch (Q1) is connected in series with a normally-off Si MOSFET switch (M1), the source of Q1 being connected to the drain of M1; and the low side switch is a normally-on switch, comprising a second normally-on GaN transistor switch (Q2); and a half-bridge driver circuit comprising:

a high-side driver for directly driving a gate of Q1;
a low-side driver for directly driving a gate of Q2;
wherein the high-side driver and the low-side driver are driven by PWM input signals INH and INL respectively; and a control circuit for driving M1, wherein the control circuit comprises a gate driver for providing an enable (control) signal for directly driving the gate of M1 in response to a gate input signal PGOOD, the control circuit having a voltage sense input Vsen from a voltage sense terminal connected to a node between the source of Q1 and the drain of M1, circuitry for receiving a UVLO signal, and determining a power status and operational mode for M1, circuitry for comparing the voltage sense input Vsen to a reference OCP limit voltage $V_{OCP\_limit}$, wherein said enable signal provides that M1 is OFF during start-up until UVLO is off;
M1 is ON for normal operation;
M1 is turned-off during a fault condition if UVLO is turned-on;
and
if OCP is triggered, M1 is ON and Q1 and Q2 are turned-off.

For example, Q1 has a source, a drain and a gate, wherein the drain of Q1 is connected to the high voltage DC bus and the source of Q1 is connected to a drain of M1, and the gate of Q1 is connected to a first gate drive terminal for directly driving the gate of Q1; the source of M1 is connected to the switching node, a gate of M1 is connected to an enable (control) terminal for directly driving the gate of the M1; a high-side ground terminal is connected to the source of M1; and a voltage sense terminal is connected a common point between the source of Q1 and the drain of M1; and Q2 has a source, a drain and a gate, the drain of Q2 is connected to the switching node and the source of Q2 is connected to the low voltage DC bus, and the gate of Q2 is connected to a second gate drive terminal for directly driving the gate of Q2; and a low-side ground terminal is connected to the source of Q2;

and a control circuit for driving M1, wherein the control circuit comprises a gate driver for providing an enable (control) signal for directly driving the gate of M1 in response to a gate input signal PGOOD, a voltage sense input Vsen from a voltage sense terminal connected to a node between the source of Q1 and the drain of M1, a UVLO signal input, and circuitry for determining a power status and operational mode for M1, circuitry for comparing the voltage sense input Vsen to a reference OCP limit voltage $V_{OCP\_limit}$ and triggering OCP if Vsen exceeds the OCP limit voltage;

wherein said enable signal provides that:

M1 is OFF during start-up until UVLO is off;
M1 is ON for normal operation;
M1 is turned-off during a fault condition if UVLO is turned-on;
and
if OCP is triggered, M1 is ON and Q1 and Q2 are turned-off.

Half bridge modules of example embodiments are referred to as protected direct drive D-mode half-bridge modules. Example embodiments are described for high power applications, such as inverters for motor drives Also provided is a method of operation of a protected direct drive D-mode half-bridge module as described herein.

BRIEF DESCRIPTION OF THE DRAWINGS

FIG. 3 shows some schematic diagrams to illustrate switching waveforms for various operational modes of the direct drive D-mode GaN half-bridge module of the example embodiment;

FIG. 4 shows a table to illustrate switching states of each element of the direct drive D-mode GaN half-bridge module of the example embodiment for the different operational modes illustrated schematically in FIG. 3; and.

Figure 1:
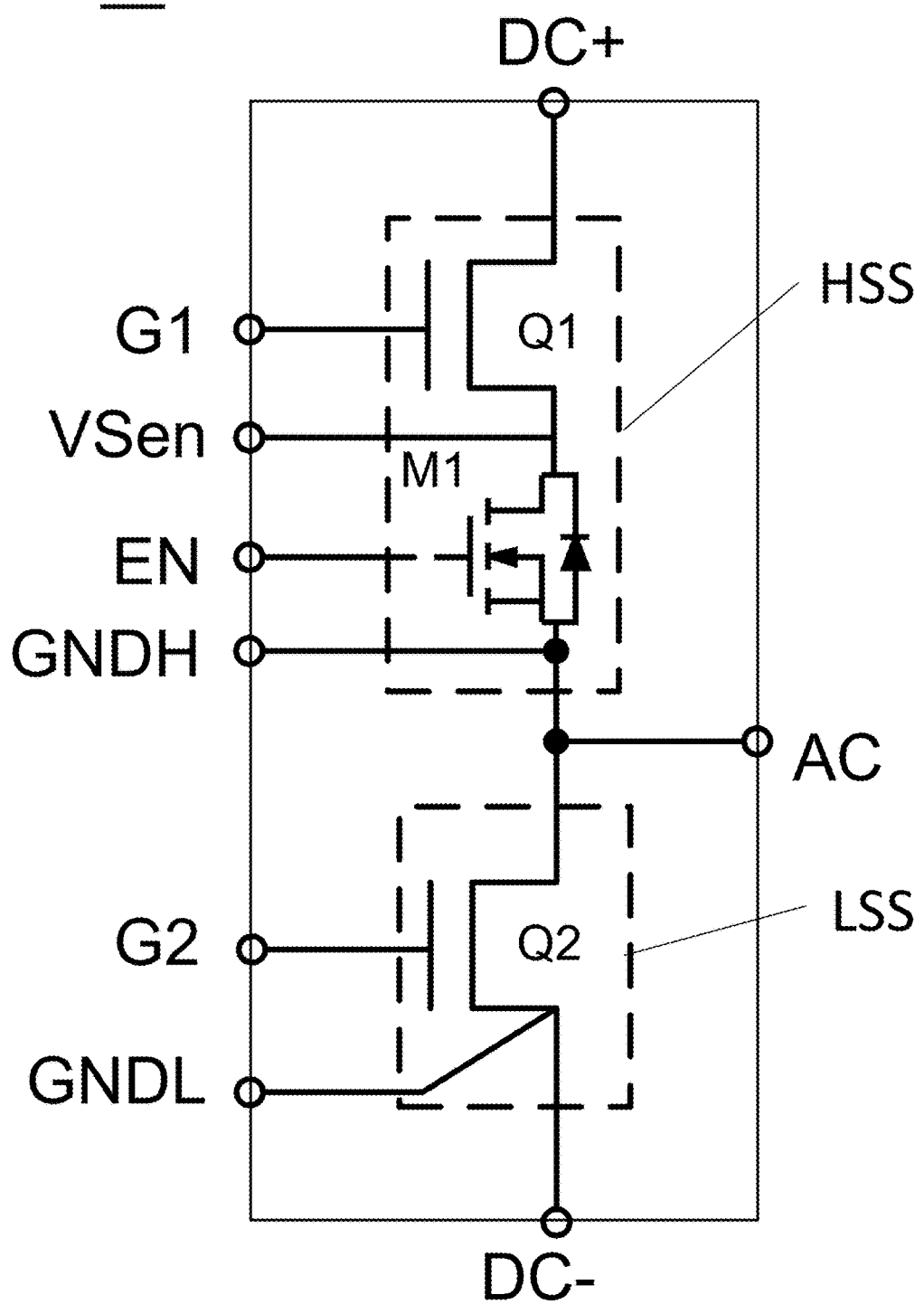
FIG. 1 shows a circuit schematic for a direct drive D-mode GaN half-bridge module of an example embodiment.

The foregoing and other features, aspects and advantages will become more apparent from the following detailed description, taken in conjunction with the accompanying drawings, of example embodiments, which description is by way of example only.

DETAILED DESCRIPTION

The following description refers to depletion-mode (D-mode) transistors and enhancement-mode (E-mode) transistors. An E-mode transistor is a normally-off device, which has a positive threshold voltage; when the gate-to-source voltage Vgs is below the threshold voltage, e.g. when Vgs=0, an E-mode transistor is in an off-state; it requires a positive gate drive voltage Vgs to turn-on. A D-Mode transistor is a normally-on device, which has a negative threshold voltage, so that when Vgs=0 it is in an on-state, and it requires a negative gate drive voltage Vgs to be turned-off.

A III-Nitride HEMT, e.g. a GaN HEMT, comprises a hetero-structure comprising a channel layer and a barrier layer which have different bandgaps that create a twodimensional electron gas (2DEG). For example, a GaN HEMT may be fabricated with a GaN channel layer and an AlGaN barrier layer. A GaN HEMT with a Schottky gate is inherently a D-mode device because of the 2DEG. A normally-off E-mode GaN HEMT can be achieved by providing a layer of p-doped GaN (p-GaN) under the gate metal. Other types of lateral GaN FETs include e.g. MISHEMTs and MISFETs; these may be fabricated with various gate structures to provide normally-on or normally-off operation.

Initial development of III-Nitride HEMTs for power applications focused on normally-on, D-mode GaN HEMTs. However, most power switching applications require E-mode power switching devices for safety reasons and failsafe operation. For example, in a power switching stage comprising D-mode switches, there is a possibility of damaging a circuit or a load if a power switching stage is powered up prior to biasing the gates of the D-mode switches to hold them in a non-conductive or off-state. E-mode or normally-off switches are preferred for failsafe operation during start-up or a fault condition.

Normally-off operation can be achieved by providing a high-voltage D-mode HEMT in series with a low-voltage Si MOSFET in a cascode configuration (e.g. see U.S. Pat. No. 9,692,408B2 and U.S. Pat. No. 9,406,674B2), so that the D-mode HEMT is driven indirectly by a gate drive applied to the gate of the Si MOSFET. However, a D-mode cascode device presents challenges for controlling switching speed. There is added loss and Qrr from the Si MOSFET when used in a cascode configuration.

It is also known to provide a D-mode half-bridge comprising a DC enable switch (e.g. see U.S. Pat. No. 9,349,715B2) using a Si-IGBT to disable connection to the DC bus in the event of a fault condition. However, in this circuit topology the Si-IGBT enable switch has to withstand the DC high voltage, so it will have high losses, and high cost. Also, this approach is limited by the relatively slow response time of the Si-IGBT switch to disconnect the DC bus in the event of a power failure to the controller and gate driver.

E-mode lateral GaN HEMTs using p-GaN gate structures are now commercially available from a number of vendors for 100V and 650V applications. E-mode lateral GaN HEMTs are driven by a positive gate bias, provide ease of switching speed control, and low losses.

For high power applications, such as electric vehicle traction inverters, a plurality of GaN HEMTs may need to be paralleled to increase the system power capability or enhance the system efficiency. As an example, some traction inverter applications may require power in the range of ~100 kW to ~200 kW, providing a current of several hundred amps, and depending on factors such as the DC bus voltage, required peak current, die design, and current capability of each GaN HEMT, each power switch might require multiple device in parallel to handle a required peak current.

For some high current applications, there is an advantage to using D-mode GaN HEMTs. The current capability of an E-mode GaN HEMT is limited by the saturation current Idsat at the high temperature limit. Also, the threshold voltage of an E-mode GaN HEMT may be in a range of e.g. 1.5V to 1.7V and typically the gate is driven by a voltage of e.g. 6V or 7V for turn-on; E-mode devices may therefore be sensitive to gate noise, so there is a smaller gate voltage differential between turn-on and turn-off. For an equivalently sized D-mode GaN HEMT, there is a significant current driving capability advantage over an E-mode GaN HEMT. One reason is that the gate of a D-mode GaN HEMT can withstand higher gate-to-source voltage Vgs than the gate of an E-mode GaN HEMT. For example, if the threshold voltage of a D-mode GaN HEMT is in the range of –e.g. 2V or –3V, and for turn-off the gate is driven with a gate-source voltage in a range of –10V to –20V, e.g. –15V, there is an overdrive of >10V. In high power applications where the power modules are used with multiple transistors connected in parallel, high gate loop inductance combined with high switching noise may induce higher gate noise. D-mode devices which can tolerate higher gate ringing and parasitic inductance may be preferred over E-mode devices. Another reason relates to saturation current: when a D-mode device uses a higher gate drive bias than an E-mode device, it can have higher current capability than E-mode of equivalent size.

In high current applications, such as motor drives or traction invertors it would be beneficial to be able to take advantage of these characteristics of D-Mode GaN HEMTs. However, the "normally-on" characteristic of D-mode GaN HEMTs is a disadvantage over E-mode GaN HEMTs with respect to failsafe operation.

There is a need for an architecture which takes advantage of the high current driving capability of D-mode GaN HEMTs while mitigating this disadvantage of normally-on operation relative to normally-off E-Mode GaN HEMTs, to ensure failsafe operation, e.g. during start-up or a fault condition.

Disclosed herein is a protected direct-drive D-mode GaN half-bridge module of an example embodiment, which takes advantage of superior current driving characteristics of D-mode GaN HEMTs for normal operation, while providing failsafe operation and overcurrent protection.

FIG. 1 shows a circuit schematic for a single-phase protected direct-drive D-mode GaN half-bridge module 10 of an example embodiment. The high-side switch HSS of the half-bridge module comprises a D-mode (normally-on) GaN power semiconductor transistor switch Q1 and a E-mode low voltage (LV) silicon MOSFET switch M1, which are connected in series. The low-side switch LSS of the half-bridge module comprises a D-mode (normally-on) GaN power semiconductor transistor switch Q2. In the high-side switch, M1 acts as a protection FET to prevent shoot-through during start-up or a fault condition. During normal operation, M1 is constantly turned-on and acts like a shunt resistor in series with Q1. Current flowing in Q1 creates a voltage drop across M1. The common point between the source of Q1 and the drain of M1 provides a voltage sense output Vsen to an external gate driver. The voltage across M1, between Vsen and the ground terminal of the high-side switch GNDH, is constantly monitored and overcurrent protection (OCP) will be triggered when Vsen is higher than a reset limit $V_{OCP\_limit}$. When OCP is triggered, Q1 will be turned off to prevent device failure. The advantage of M1 is dual-purpose. It is used to convert the high-side D-mode (normally-on) switch to a direct drive normally-off high-side switch, and M1 also acts as a shunt resistor for fast overcurrent protection. As the high-side switch HSS has included OCP protection, for certain applications where the low-side switch can be safely kept on during a fault condition, such as inverters for motor drives, step down DC/DC converters, or other switch topologies, the low-side switch Q2 can simply be a D-mode (normally-on) switch. The normally-on low-side switch LSS provides for cost saving and improvement in efficiency.

Figure 2:
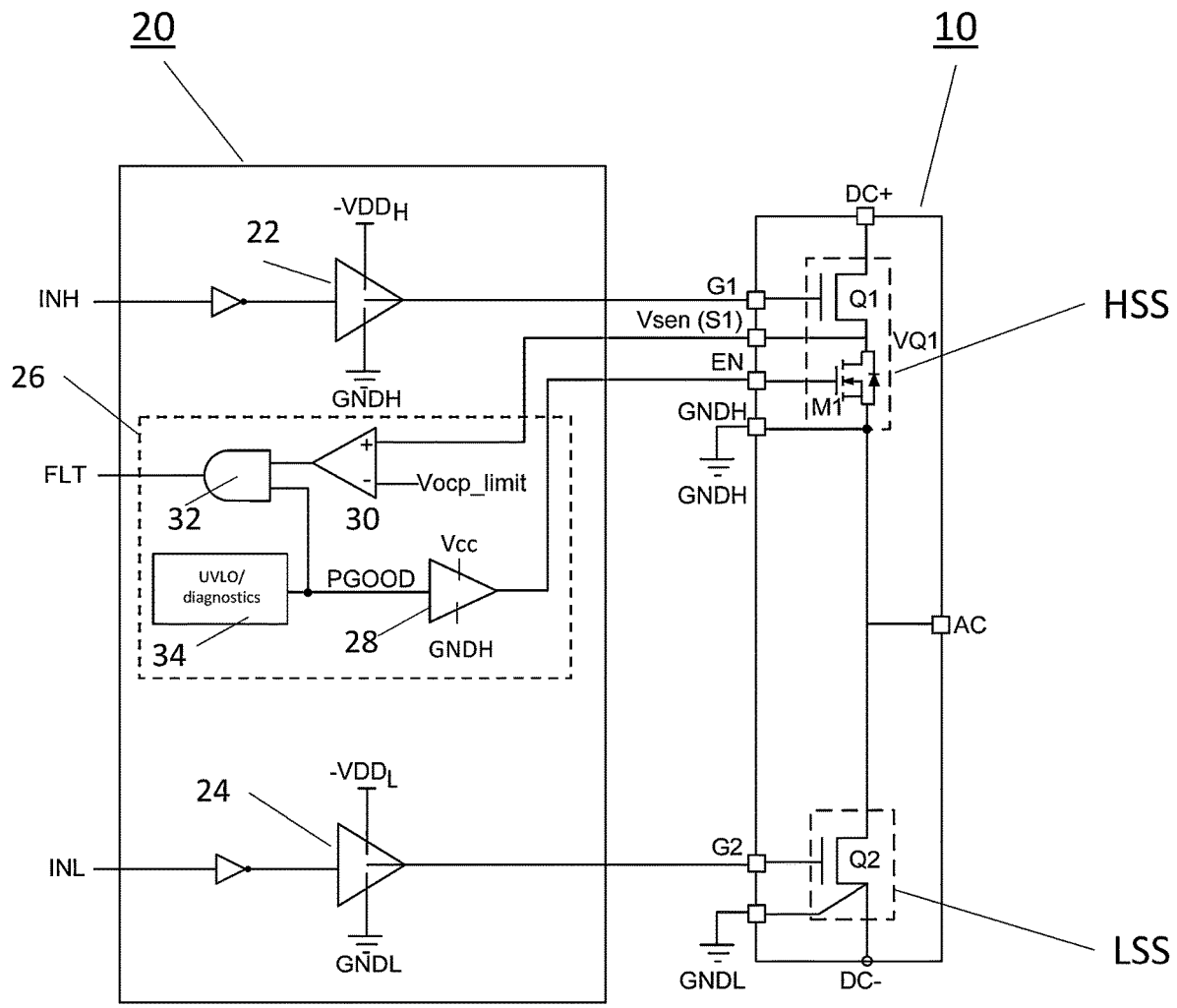
FIG. 2 shows a circuit schematic for a direct drive D-mode GaN half-bridge module and gate driver circuit of an example embodiment.

FIG. 2 shows a circuit schematic for a protected direct drive D-mode GaN half-bridge module 10 and a half-bridge gate driver circuit 20 of an example embodiment. The high-side and low-side D-mode GaN switches Q1 and Q2 are driven directly by a high-side driver 22 and a low-side driver 24 of the half-bridge gate driver 20, using gate drive input signals INH and INL respectively. The Si MOSFET M1 is driven by a control circuit 26 comprising gate driver 28 receiving a gate drive signal, labelled PGOOD, so that M1 turned-on during normal operation, and M1 is turned-off during start-up, or under-voltage lock-out (UVLO). That is, PGOOD is low (off) during start up and UVLO, and PGOOD is high (on) when $V_{CC}$ has ramped up to reach an operational value and UVLO is off.

Since Q1 and Q2 are both D-mode (normally-on) GaN devices, they require a negative gate drive voltage Vgs (Q1) and Vgs(Q2) to be turned-off. M1 is an E-mode (normally-off) device, so it requires a positive gate drive voltage Vgs(M1) to turn-on. This means that before power-up, Q1 and Q2 are on, and M1 is off.

During Start-Up:

Q1 and Q2 are on due to lack of negative gate drive and M1 is off. The gate G1 of Q1 is connected to the high-side ground GNDH. When the DC bus rail (DC+) ramps up, all the voltage will be applied across to M1 (Vsen−GNDH). The voltage accumulated across M1 is applied to the gate of Q1 as a negative bias VGS(Q1)=−V(M1).

When VGS(Q1) exceeds the threshold voltage Vth of Q1, Q1 will be turned-off, so that the high-side switch (Q1 and M1) is off.

When start-up is complete and agate bias supply (−VDDL) for the gate of Q2 is within specifications, Q1 gate driver will bias G1 to −VDDH and then PGOOD signal is ON which turns on M1.

Normal Operation:

MOSFET M1 is kept on during the entire normal operational period until the next UVLO event.

PWM signals (INH/NL) directly drive the gate G1 of Q1 and the gate G2 of Q2.

Voltage Sensing and Overcurrent Protection (OCP):

During normal operation, the sense voltage output Vsen, from the drain of M1, can be monitored in real time to detect an overcurrent event. When Vsen is higher than a specified reset limit (Vocp_limit), a fault signal is triggered and the gate G1 of Q1 can be turned off to prevent device failure.

When the PGOOD is low, so that M1 is off, monitoring of the voltage sense signal Vsen is disabled.

Figures 3, 4:
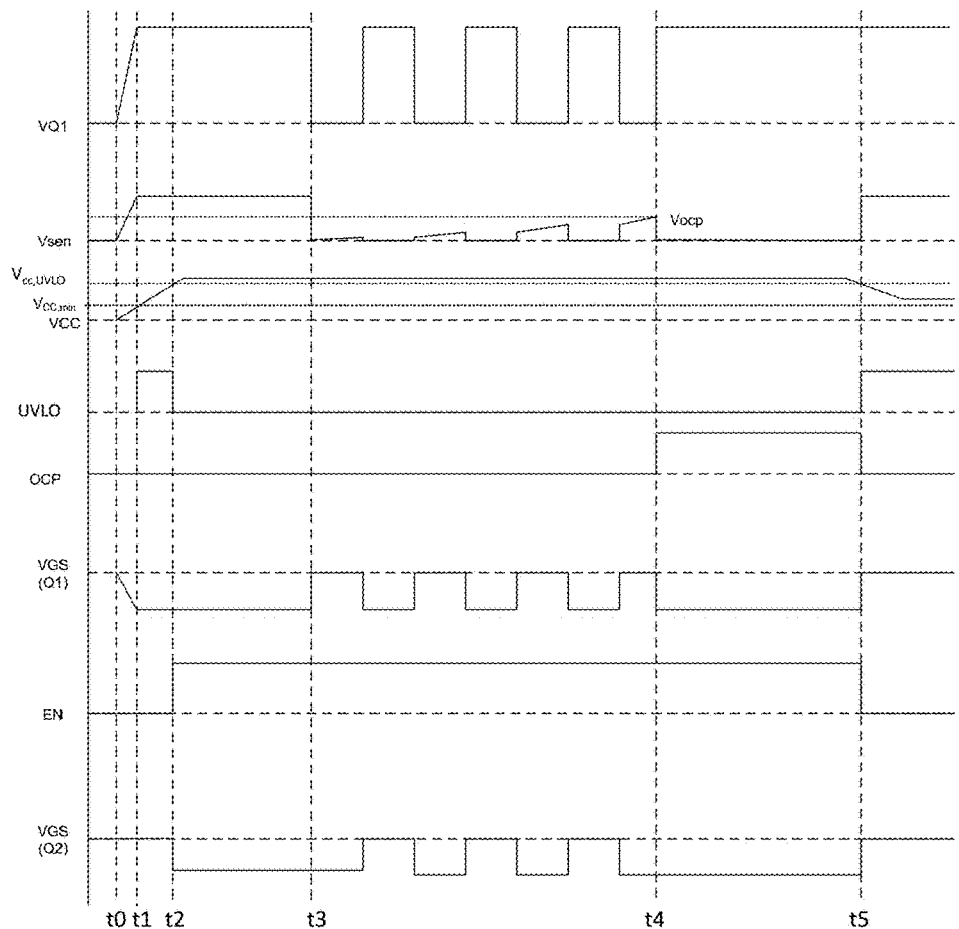

FIG. 3 shows some schematic diagrams to illustrate switching waveforms for various operational modes of the direct drive D-mode GaN half-bridge module and half-bridge driver of the example embodiment. FIG. 4 shows a table to illustrate switching states of each element of the direct drive D-mode GaN half-bridge module of the example embodiment for the different operational modes illustrated schematically in FIG. 3.

As illustrated in FIG. 3 and FIG. 4, at power-up, time to, when the main power is turned-on, the HSS is off because M1 is off. Q1 and Q2 are on, and UVLO and OCP are disabled. At time t1, when $V_{CC}$ reaches a minimum value $V_{CCmin}$, UVLO is on (high), OCP is off (low). At time t2, when $V_{CC}$ ramps up to exceed $V_{CC,\ UVLO}$, for normal operation, UVLO is turned off (low), and Q1 is turned off, and M1 is turned on, when M1 gate drive signal (enable signal EN) goes high, and Q2 is turned off. At time t3, the system is ready for normal operation with Q1 and Q2 being directly driven by pulse width modulation (PWM) controlled by high-side and low-side gate drive signals INH and INL, respectively.

At time t4, to show an example of triggering of OCP, if the sense voltage Vsen sensed by circuit 26 exceeds an OCP limit $V_{OCP\_limit}$, e.g. ~7V, OCP is triggered to provide a fault signal FLT to maintain Q1 and Q2 off. At time t5, as an example, if VCC drops below $V_{CC,UVLO}$, and UVLO is turned on, PGOOD will go low to turn off M1, and Q1 and Q2 are on.

As an example, the Si MOSFET M1 may be a 30V or 40V Si MOSFET, e.g. having an on-resistance of a few mΩ.

During normal operation M1 is on, and Q1 and Q2 are both directly driven to provide normal operation of the D-mode half-bridge. If Vcc falls below $V_{CC\_UVLO}$, the control circuit operates to turn off M1, so that the HSS is off. If Vsen exceeds $V_{OCP\_limit}$, so that OCP is triggered, Q1 and Q2 are turned-off.

Figure 5:
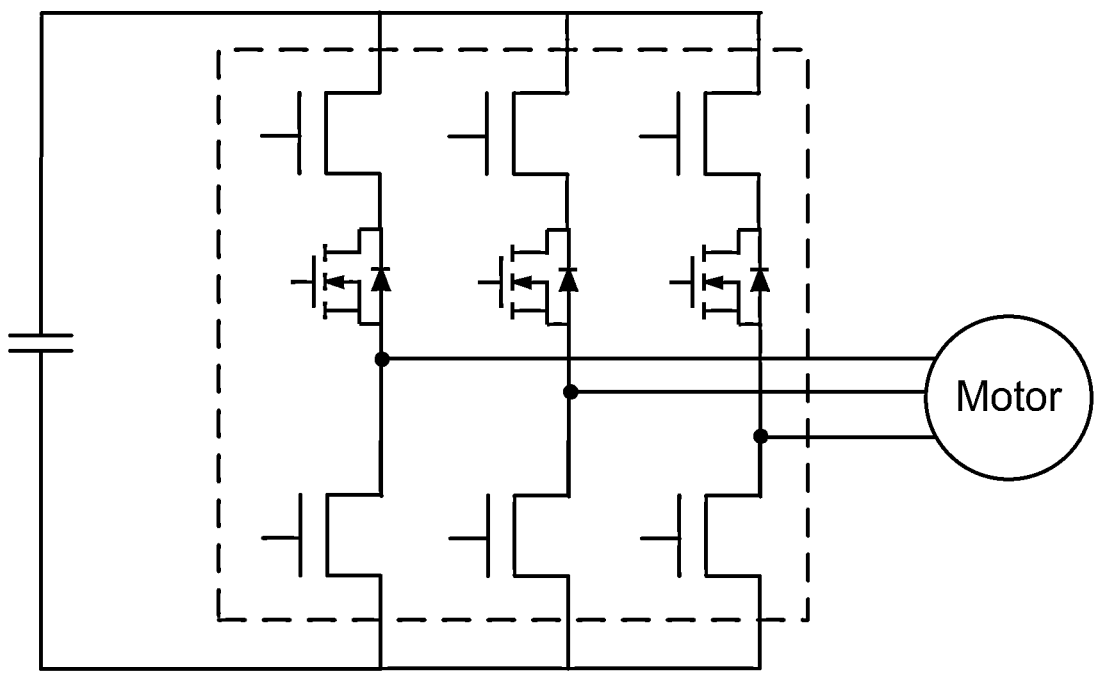
FIG. 5 shows a circuit schematic for a 3-phase inverter of an example embodiment for driving a motor, wherein each phase leg comprises a direct drive D-mode GaN half-bridge module as illustrated in FIG. 1.

FIG. 5 shows a circuit schematic for a 3-phase direct drive D-mode GaN half-bridge module configured as a traction inverter for driving a motor. For example, the half-bridge module for each phase is driven by a gate driver such as shown in FIG. 2. For applications such as traction inverters for electric vehicles, and other motor drives, it is not necessary to have a normally-off low-side switch. If power to the driver is lost, the normally-on low-side switches short the 3-phase winding of the motor, and any extra energy is dumped in the low side, to avoid damage to the inverter.

The protected direct-drive D-mode half-bridge module is suitable for high power applications in which the AC switch node is connected to a load, such as a traction inverter for driving a motor, or e.g. a buck converter which is connected to a load, where it is safe for the LSS to be a normally-on switch.

To provide sufficient current capacity for high power applications such as traction inverters for electric vehicles and industrial motor drivers, for example to provide a required rms current of 500 A required for a 150 kW traction inverter, each of the HSS and LLS comprise multiple power switching devices connected in parallel. While FIG. 1 and FIG. 2 show single transistor elements for each of Q1, M1, of the HSS and Q2 of LSS, in practice, for high power applications, each of switches Q1, M1, and Q2 comprises a plurality of transistors connected in parallel, to provide a required current capability. For example, an inverter power module would provide a power substrate and housing for mounting of each of switches Q1, M1 and Q2, comprising multiple transistors connected in parallel, with low inductance interconnections. Where multiple transistors are connected in parallel, power module designs which reduce parasitics, such as such as parasitic inductances, are desirable.

It is to be noted that a protected direct-drive D-mode half-bridge module as described herein, wherein the LSS is a normally-on switch, is not suitable for some applications, such as Switching Mode Power Supplies (SMPS) or Boost PFC (Power Factor Correction) Converters, where the midpoint, AC switch node, is connected to the AC grid. Other solutions using E-mode half-bridge modules are needed for these applications, so that both the HSS and LSS are normally-off switches.

For high power applications, such as traction inverters, a half-bridge module implemented with direct drive D-mode GaN HEMTs as described herein, comprising a protected direct drive high-side D-mode GaN switch and a direct drive D-mode low-side GaN switch, offer several benefits vs. other known implementations of half-bridge modules using D-mode (normally-on) GaN HEMTs or E-mode (normally-off) GaN HEMTs.

On the other hand, there may be a trade-off between the characteristics and driver requirements for D-mode GaN HEMTs and E-mode GaN HEMTs for different applications. For applications where failsafe operation of E-mode (normally-off) GaN HEMTs is important or critical, and E-mode GaN HEMTs with suitably high current capability are available, it may be preferred to use E-mode GaN HEMTs, having a positive threshold voltage.

Driver and control circuitry for D-mode GaN HEMTs is more complex, requires a negative voltage supply to provide the negative threshold voltage for turn-off, and additional components to ensure failsafe operation. On the other hand, as mentioned above, for equivalently sized and driven device (e.g. same die area/same Vgs-Vth), there may be a significant advantage in current capability for a D-mode GaN HEMT relative to an E-mode GaN HEMT. For example, a D-mode GaN HEMTs may have a higher saturation current Idsat, and lower specific on-resistance Rsp=Rdson*device area (mmΩ*mm$^2$). Where a higher current driving capability of D-mode devices can offset the added complexity of driving D-mode devices to ensure failsafe operation, a solution using D-mode GaN HEMTs may be justified. For other applications, it may be preferred to use a half-bridge module comprising E-mode GaN HEMTs.

For example, E-mode GaN HEMTs may be driven by a gate-to-source voltage in a range of e.g. +6V or +7V to turn-on and 0V or a negative voltage (e.g. −3V) to turn-off. A D-mode GaN HEMT is on with Vgs=0V, and a negative Vgs, e.g. in a range of −10V to −20V, is used to turn-off.

A Si MOSFET having an on-resistance of a few mΩ (e.g. 1 or 2 mΩ) is suitable to sense current and provide fault signal based on a voltage drop between the drain and source of the Si MOSFET. While this would not provide accurate current sensing, it provides a sense voltage signal for high-side monitoring for OCP.

The LV Si MOSFET in series with the high-side D-mode switch Q1 converts the high-side switch to a normally-off device to provide failsafe operation. The LV Si MOSFET also provides for OCP. This half-bridge module is therefore referred to as a Protected Direct Drive D-mode GaN HEMT half-bridge. The protected direct-drive D-mode GaN half-bridge module disclosed herein takes advantage of superior current driving characteristics of D-mode GaN HEMTs for normal operation, while providing failsafe operation and overcurrent protection.

The architecture takes advantage of the high current driving capability of D-mode GaN HEMTs, while mitigating issues of failsafe operation for normally-on operation of D-mode GaN HEMTs relative to normally-off E-Mode GaN HEMTs.

In the example embodiments, the HSS and the LSS comprise D-mode GaN HEMTs. Other types of D-mode GaN FETs may be used.

Also provided is a method of operating a protected direct drive D-mode GaN half-bridge module as described herein. D-mode switches Q1 and Q2 require negative voltage to turn off, so VDDH and VDDL are both negative (e.g. −15V) to turn off Q1 and Q2, and at 0V both Q1 and Q2 are ON, so gate voltage swing is e.g. −15V to 0V. Vcc is typical positive voltage to turn on Si MOSFET (e.g. gate output from M1 driver 28 to EN is e.g. 12V for M1 ON and 0V for M1 ON). A control circuit provides functionality for driving the gate of M1, in response to a signal indicative of a power condition and a signal of indicative of a OCP condition. Detection of an OCP condition triggers a fault signal FLT to turn-off Q1 and Q2, but M1 remains on. UVLO on holds PGOOD low so M1 is off until UVLO is off, when UVLO is off, PGOOD goes high, so M1 turns on for the duration of normal operation.

The protected direct drive D-mode half-bridge module provides the following advantages relative to other known D-mode solutions using a DC enable switch or a cascode solution:

- The added Si MOSFET provides for failsafe operation of the D-mode half-bridge module, e.g. during start-up of a fault condition;
- There is low loss because there is only one added Si MOSFET switch and, since the Si MOSFET switch remains on during normal operation, there is no QRR;
- The Si MOSFET switch also functions for sensing and OCP; an additional current sensing and OCP circuit is not needed;
- Direct gate drive makes it is easier to control dv/dt and avoids dynamic switching reliability issues compared to a cascode solution;
- There is lower loss and lower cost compared to a DC enabled switch or a true half bridge with both a high-side and a low-side LV MOSFET;
- For failsafe operation of traction inverters, it is preferred to have the low-side switch turned-on during system failure to short the motor winding and prevent damage to the inverter.

The comparison between typical operating parameters and performance characteristics of example E-mode GaN HEMTs and example D-mode GaN HEMTs disclosed herein is provided by way of example only, considering devices that are currently commercially available. It is apparent that ongoing development of both E-mode GaN HEMTs and D-mode GaN HEMTs will lead to significant performance improvements in the future. For example, improvements to E-mode GaN HEMTs may provide the improved current capability, exceeding that of currently available D-mode GaN HEMTS, and of course E-mode GaN HEMTs provide the benefit of normally-off (e.g. failsafe) operation. The protected direct-drive D-mode GaN half-bridge power module is intended to provide a solution for some applications in which the performance characteristics of D-mode GaN HEMTs can be used to an advantage.

Although example embodiments have been described and illustrated in detail, it is to be clearly understood that the same is by way of illustration and example only and not to be taken by way of limitation, the scope of the present invention being limited only by the appended claims.

The invention claimed is:

1. A direct drive D-mode half-bridge power module comprising a high-side switch and a low-side switch connected in series, wherein the high-side switch is a D-mode normally-on GaN transistor switch (Q1) in series with an E-mode normally-off Si MOSFET switch (M1) and the low-side switch is a D-mode normally-on GaN transistor switch (Q2), wherein gates of the D-mode normally-on GaN transistor switches Q1 and Q2 are directly driven, and the gate of E-mode normally-off Si MOSFET M1 is directly driven by a control signal, wherein M1 acts as a protection FET to hold the high-side switch in an off-state during start-up and during a fault condition.

2. The direct drive D-mode half-bridge power module of claim 1, comprising a control circuit which determines the operational mode of M1 responsive to an undervoltage lock-out (UVLO) signal and a voltage sense signal indicative of an overcurrent event.

3. The direct drive D-mode half-bridge power module of claim 2, wherein the control circuit operates so that: M1 is OFF during start-up until UVLO is off, M1 is ON for normal operation; M1 is turned-off during a fault condition if UVLO is turned-on; and if overcurrent protection (OCP) is triggered, M1 is ON and Q1 and Q2 are turned-off.

4. A traction inverter comprising a multi-phase motor driver, wherein each phase leg comprises a half-bridge module as defined in claim 1.

5. A method of operation of a half-bridge module as defined in claim 1, wherein a control circuit is configured to determine an operational mode of M1 responsive to an undervoltage lock-out (UVLO) signal and a voltage sense signal indicative of an overcurrent event, the control circuit operating so that: M1 is OFF during start-up until UVLO is off; M1 is ON for normal operation; M1 is turned-off during a fault condition if UVLO is turned-on; and if overcurrent protection (OCP) is triggered, M1 is ON and Q1 and Q2 are turned-off.

6. A power semiconductor switching device comprising:
a high-side switch and a low-side switch connected in series in a half-bridge configuration, between a high voltage DC bus and a low voltage DC bus, the high side switch being connected to the low side switch at a switching node, wherein:
the high-side switch is a normally-off switch wherein a first normally-on GaN transistor switch (Q1) is connected in series with a normally-off Si MOSFET switch (M1), the source of Q1 being connected to the drain of M1;
the low side switch is a normally-on switch, comprising a second normally-on GaN transistor switch (Q2);
wherein gates of the D-mode normally-on GaN transistor switches Q1 or Q2 are directly driven, and the gate of the E-mode normally-off Si MOSFET M1 is directly driven by a control circuit, wherein M1 acts as a protection FET to hold the high-side switch in an off-state during start-up and during a fault condition; and
the control circuit is configured to determine an operational mode of M1 responsive to an undervoltage lock-out (UVLO) signal and a voltage sense signal indicative of an overcurrent event, the control circuit operating so that: M1 is OFF during start-up until UVLO is off; M1 is ON for normal operation; M1 is turned-off during a fault condition if UVLO is turned-on; and if overcurrent protection (OCP) is triggered, M1 is ON and Q1 and Q2 are turned-off.

7. A power semiconductor switching device comprising:
a high-side switch and a low-side switch connected in series in a half-bridge configuration, between a high voltage DC bus and a low voltage DC bus, the high side switch being connected to the low side switch at a switching node, wherein
the high-side switch is a normally-off switch wherein a first normally-on GaN transistor switch (Q1) is connected in series with a normally-off Si MOSFET switch (M1), the source of Q1 being connected to the drain of M1;
the low side switch is a normally-on switch, comprising a second normally-on GaN transitory switch (Q2); and
Q1 has a source, a drain and a gate, wherein the drain of Q1 is connected to the high voltage DC bus and the source of Q1 is connected to a drain of M1, and the gate of Q1 is connected to a first gate drive terminal for directly driving the gate of Q1; the source of M1 is connected to the switching node, a gate of M1 is connected to an enable (control) terminal for directly driving the gate of the M1; a high-side ground terminal is connected to the source of M1; and a voltage sense terminal is connected to a common point between the source of Q1 and the drain of M1; and
Q2 has a source, a drain and a gate, the drain of Q2 is connected to the switching node and the source of Q2 is connected to the low voltage DC bus, and the gate of Q2 is connected to a second gate drive terminal for directly driving the gate of Q2; and a low-side ground terminal is connected to the source of Q2.

8. The power semiconductor switching device of claim 7 wherein: M1 acts as a protection FET to hold the high-side switch in an off-state during start-up and a fault condition.

9. The power semiconductor switching device of claim 7, wherein:
Q1 comprises a plurality of GaN transistors connected in parallel;
M1 comprises a plurality of Si MOSFETs connected in parallel;
Q2 comprises a plurality of GaN transistors connected in parallel.

10. The power semiconductor switching device of claim 7, wherein:
Q1 comprises a plurality of GaN HEMTs connected in parallel;
M1 comprises a plurality of Si MOSFET connected in parallel;
Q2 comprises a plurality of GaN HEMTs connected in parallel.

11. The power semiconductor switching device of claim 6 wherein:
Q1 comprises a plurality of GaN transistors connected in parallel;
M1 comprises a plurality of Si MOSFETs connected in parallel;
Q2 comprises a plurality of GaN transistors connected in parallel.

12. A power semiconductor switching device comprising:
a high-side switch and a low-side switch connected in series in a half-bridge configuration, between a high voltage DC bus and a low voltage DC bus, the high side switch being connected to the low side switch at a switching node, wherein:
the high-side switch is a normally-off switch wherein a first normally-on GaN transistor switch (Q1) is connected in series with a normally-off Si MOSFET switch (M1), the source of Q1 being connected to the drain of M1; and
the low side switch is a normally-on switch, comprising a second normally-on GaN transistor switch (Q2); and
a half-bridge driver circuit comprising:
a high-side driver for directly driving a gate of Q1;
a low-side driver for directly driving a gate of Q2;
wherein the high-side driver and the low-side driver are driven by PWM input signals INH and INL respectively; and
a control circuit for driving M1, wherein the control circuit comprises a gate driver for providing an enable (control) signal for directly driving the gate of M1 in response to a gate input signal PGOOD,
the control circuit having a voltage sense input Vsen from a voltage sense terminal connected to a node between the source of Q1 and the drain of M1,
circuitry for receiving an undervoltage lock-out (UVLO) signal, and determining a power status and operational mode for M1, circuitry for comparing the voltage sense input Vsen to a reference overcurrent protection (OCP) limit voltage $V_{OCP\_limit}$, wherein said enable signal provides that M1 is OFF during start-up until UVLO is off;
M1 is ON for normal operation;
M1 is turned-off during a fault condition if UVLO is turned-on;
and
if OCP is triggered, M1 is ON and Q1 and Q2 are turned-off.

13. The power semiconductor switching device of claim 12 comprising:

a high-side switch and a low-side switch connected in series in a half-bridge configuration, between a high voltage DC bus (rail) and a low voltage DC bus (rail), the high side switch being connected to the low side switch at a switching node, wherein:

the high-side switch is a normally-off switch wherein a first normally-on GaN transistor switch (Q1) is connected in series with a normally-off Si MOSFET switch (M1); and the low side switch is a normally-on switch, comprising a second normally-on GaN transistor switch (Q2); wherein:

Q1 has a source, a drain and a gate, wherein the drain of Q1 is connected to the high voltage DC bus and the source of Q1 is connected to a drain of M1, and the gate of Q1 is connected to a first gate drive terminal for directly driving the gate of Q1; the source of M1 is connected to the switching node, a gate of M1 is connected to an enable (control) terminal for directly driving the gate of the M1; a high-side ground terminal is connected to the source of M1; and a voltage sense terminal is connected a common point between the source of Q1 and the drain of M1; and Q2 has a source, a drain and a gate, the drain of Q2 is connected to the switching node and the source of Q2 is connected to the low voltage DC bus, and the gate of Q2 is connected to a second gate drive terminal for directly driving the gate of Q2; and a low-side ground terminal is connected to the source of Q2;

a half-bridge driver circuit comprising:
a high-side driver for directly driving a gate of Q1;
a low-side driver for directly driving a gate of Q2;
wherein the high-side driver and the low-side driver are driven by PWM input signals INH and INL respectively; and a control circuit for driving M1, wherein the control circuit comprises a gate driver for providing an enable (control) signal for directly driving the gate of M1 in response to a gate input signal PGOOD, a voltage sense input Vsen from a voltage sense terminal connected to a node between the source of Q1 and the drain of M1, a UVLO signal input, and circuitry for determining a power status and operational mode for M1, circuitry for comparing the voltage sense input Vsen to a reference OCP limit voltage $V_{OCP\_limit}$ and triggering OCP if Vsen exceeds the OCP limit voltage;

wherein said enable signal provides that
M1 is OFF during start-up until UVLO is off;
M1 is ON for normal operation;
M1 is turned-off during a fault condition if UVLO is turned-on;
and
if OCP is triggered, M1 is ON and Q1 and Q2 are turned-off.

* * * * *

UNITED STATES PATENT AND TRADEMARK OFFICE
CERTIFICATE OF CORRECTION

PATENT NO. : 11,909,384 B2
APPLICATION NO. : 17/741813
DATED : February 20, 2024
INVENTOR(S) : Di Chen It is certified that error appears in the above-identified patent and that said Letters Patent is hereby corrected as shown below:

In the Claims

In Claim 6, Column 11, Line 31, "switches Q1 or Q2 are directly driven, and the gate of" should read – switches Q1 and Q2 are directly driven, and the gate of –

In Claim 7, Column 11, Line 58, "a second normally-on GaN transitory switch (Q2); and" should read – a second normally-on GaN transistor switch (Q2); and –

Signed and Sealed this
Seventh Day of May, 2024

Katherine Kelly Vidal
*Director of the United States Patent and Trademark Office*